United States Patent
Zhang et al.

(10) Patent No.: US 10,007,320 B2
(45) Date of Patent: Jun. 26, 2018

(54) SERIALIZER AND DESERIALIZER FOR ODD RATIO PARALLEL DATA BUS

(71) Applicant: QUALCOMM Incorporated, San Diego, CA (US)

(72) Inventors: Le Zhang, Shanghai (CN); Wenjun Su, San Diego, CA (US); Chulkyu Lee, San Diego, CA (US)

(73) Assignee: QUALCOMM Incorporated, San Diego, CA (US)

( * ) Notice: Subject to any disclaimer, the term of this patent is extended or adjusted under 35 U.S.C. 154(b) by 37 days.

(21) Appl. No.: 15/302,767

(22) PCT Filed: May 21, 2014

(86) PCT No.: PCT/CN2014/077979
§ 371 (c)(1),
(2) Date: Oct. 7, 2016

(87) PCT Pub. No.: WO2015/176244
PCT Pub. Date: Nov. 26, 2015

(65) Prior Publication Data
US 2017/0060218 A1    Mar. 2, 2017

(51) Int. Cl.
*G06F 13/00*    (2006.01)
*G06F 1/32*    (2006.01)
(Continued)

(52) U.S. Cl.
CPC ............... *G06F 1/324* (2013.01); *G06F 1/08* (2013.01); *G06F 13/4022* (2013.01);
(Continued)

(58) Field of Classification Search
CPC ........................... G06F 13/4282; H03M 9/00
See application file for complete search history.

(56) References Cited

U.S. PATENT DOCUMENTS 6,459,393 B1    10/2002    Nordman
6,686,856 B1    2/2004    Wang et al.
(Continued)

FOREIGN PATENT DOCUMENTS

JP    H088757 A    1/1996
JP    2003043111 A    2/2003
(Continued)

OTHER PUBLICATIONS

International Search Report and Written Opinion for PCT/CN2014/077979, dated Feb. 27, 2015, 11 pages.
(Continued)

*Primary Examiner* — Zachary K Huson
(74) *Attorney, Agent, or Firm* — Withrow & Terranova PLLC

(57) ABSTRACT

Serializers and deserializers for odd ratio parallel data buses are disclosed. In one embodiment, serializers and deserializers operating with an odd number of parallel data bits work with a half-rate clock to provide a serial data stream at a full clock rate. By providing a half-rate clock, power and area are conserved on the integrated circuit incorporating the serializer. Additionally, by providing a 7:1 serializer, the bus is now compatible with the MIPI C-PHY standard.

20 Claims, 11 Drawing Sheets

(51) Int. Cl.
*H03M 9/00* (2006.01)
*G06F 1/08* (2006.01)
*G06F 13/40* (2006.01)
*G06F 13/42* (2006.01)
*G11C 19/28* (2006.01)

(52) U.S. Cl.
CPC .......... *G06F 13/4282* (2013.01); *G11C 19/28* (2013.01); *H03M 9/00* (2013.01); *Y02D 10/14* (2018.01); *Y02D 10/151* (2018.01)

(56) References Cited

U.S. PATENT DOCUMENTS

| | | |
|---|---|---|
| 6,937,173 B2 | 8/2005 | Kim |
| 7,307,558 B1 | 12/2007 | Karim et al. |
| 8,274,412 B1 | 9/2012 | Zhang et al. |
| 8,332,518 B2 | 12/2012 | Bradshaw et al. |
| 2005/0154953 A1 | 7/2005 | Norskog |
| 2006/0103557 A1 | 5/2006 | Padaparambil |
| 2008/0143396 A1 | 6/2008 | Nishida |
| 2008/0222443 A1* | 9/2008 | Wallner ............... H03M 9/00 713/502 |
| 2009/0074407 A1 | 3/2009 | Hornbuckle et al. |
| 2012/0269255 A1 | 10/2012 | Pelteshki et al. |
| 2012/0299756 A1* | 11/2012 | Chen ............... H03M 9/00 341/101 |

FOREIGN PATENT DOCUMENTS

| | | |
|---|---|---|
| JP | 2006238302 A | 9/2006 |
| JP | 2007300362 A | 11/2007 |
| WO | 2012083279 A2 | 6/2012 |

OTHER PUBLICATIONS

Lu, Hungwen et al., "A 1.25 to 5Gbps LVDS Transmitter with a Novel Multi-Phase Tree-Type Multiplexer," 2005 Asian Solid-State Circuits Conference, Nov. 2005, IEEE, pp. 389-392.

Sawyer, Nick, "Source-Synchronous Serialization and Deserialization (up to 1050Mb/s)," Xilinx, Application Note: Spartan-6 FPGAs, XAPP1064, Version 1.2, Nov. 19, 2013, 26 pages.

Extended European Search Report for European Patent Application No. 14892827.8, dated Nov. 30, 2017, 7 pages.

International Preliminary Report on Patentability for PCT/CN2014/077979, dated Dec. 1, 2016, 6 pages.

* cited by examiner

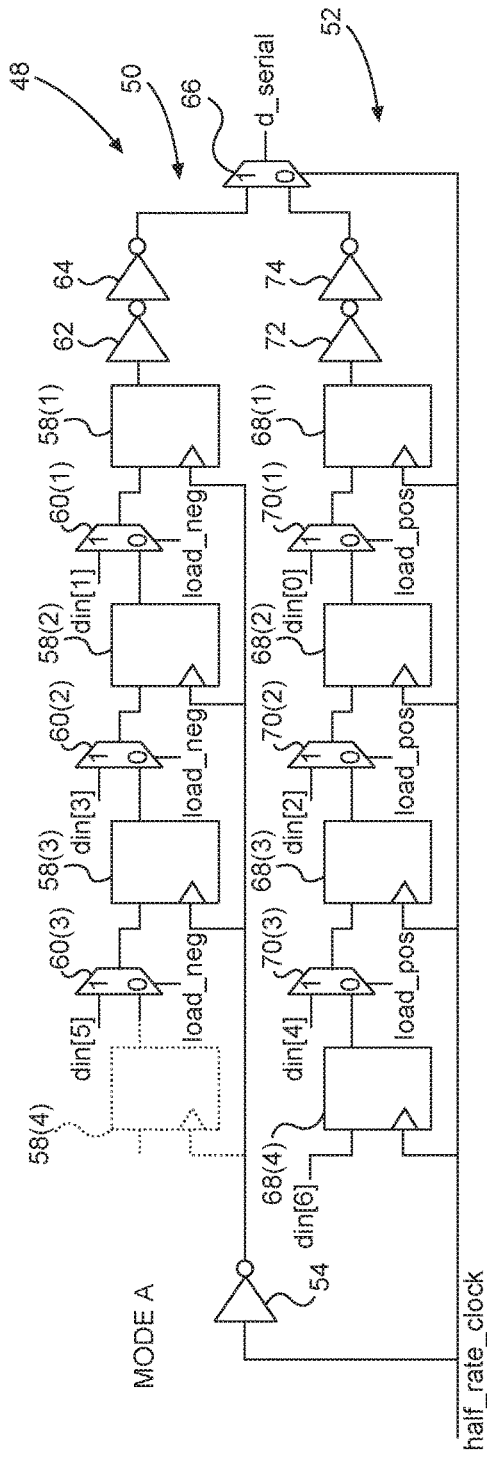
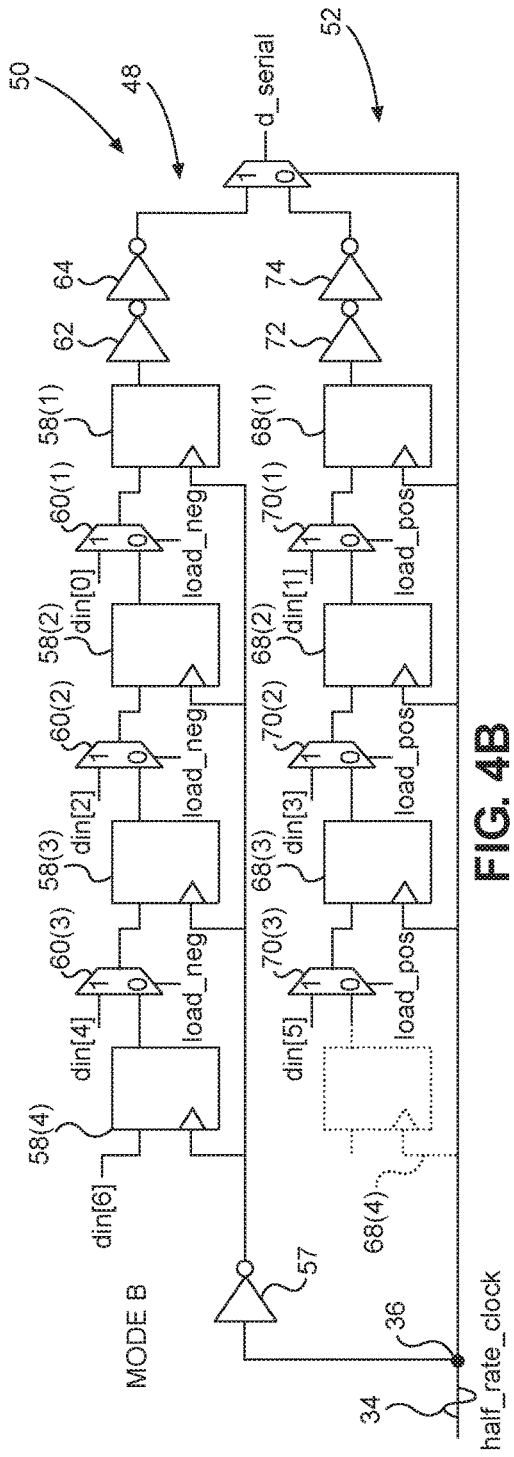
FIG. 4A
FIG. 4B

SERIALIZER AND DESERIALIZER FOR ODD RATIO PARALLEL DATA BUS

NATIONAL STAGE APPLICATION

The present application is a national stage application under 35 U.S.C. § 371 of International Patent Application No. PCT/CN2014/077979, filed May 21, 2014 and entitled "SERIALIZER AND DESERIALIZER FOR ODD RATIO PARALLEL DATA BUS," which is incorporated herein by reference in its entirety.

BACKGROUND

I. Field of the Disclosure

The technology of the disclosure relates generally to serializers and deserializers for data buses.

II. Background

Computing devices typically rely on a plurality of distinct integrated circuits (ICs) to achieve the computing functionality. These distinct ICs communicate with one another through data buses. Additional data buses may exist between an IC and a peripheral such as a plug in memory card, camera, or the like.

While a data bus may have parallel data paths, the data on a particular one of the data paths is commonly serial in nature. That is, data is accumulated and placed on the data path one bit or one symbol at a time. The serial nature of the data path is dictated in part because adding pins to accommodate many separate data paths gets prohibitively expensive both in terms of manufacturing costs and space requirements within the ICs. Thus, serialized data is prepared and placed on the data bus. At the receiving end of the data bus, the serialized data is aggregated into its original form (i.e., deserialized). Serializers and deserializers are sometimes referred to as SerDes. Numerous standard SerDes exist for even numbers of parallel data bus width (i.e., taking, for example, 8, 10, 16, 20 data lines onto a single data path within a data bus). Likewise, there are both full-rate SerDes and half-rate SerDes circuitry.

Recent proposals in the MIPI® (Mobile Industry Processor Interface) C-PHY standard call for a seven to one serializer. The even number half-rate conventional circuit structure is not able to reliably produce a seven to one serializer. While the full-rate circuit structure works well for both even and odd number serialization, such circuit structure consumes relatively large amounts of power. Further, the full-rate structure is relatively slow compared to the half-rate solution. However, to date, there have been no viable half-rate odd numbered SerDes. Accordingly, there is a need for a half-rate odd numbered SerDes.

SUMMARY OF THE DISCLOSURE

Embodiments disclosed in the detailed description include serializers and deserializers for odd ratio parallel data buses. In particular, serializers and deserializers operating with an odd number of parallel data bits work with a half-rate clock to provide a serial data stream at a full clock rate.

By providing a half-rate clock, power and area are conserved on the integrated circuit (IC) incorporating the serializer. Additionally, by providing a 7:1 serializer, the bus is now compatible with the MIPI C-PHY standard.

In this regard in one embodiment, a communication interface within an IC is disclosed. The communication interface comprises a serializer, the serializer comprising a clock input configured to receive a clock signal, a parallel data input configured to receive 2N+1 bits in parallel where N is an integer, the parallel data input comprising a divided clock input and a divider configured to receive the clock signal from the clock input and output a first divided clock signal to the divided clock input. The serializer also comprises a shift register comprising a first branch of N+1 registers, a second branch of N+1 registers, an inverter configured to receive the clock signal and provide an inverted clock signal to the first branch and an output combining outputs from the first branch and the second branch at twice a frequency of the clock signal. The serializer also comprises a selector configured to route bits received at the parallel data input to registers within the shift register according to one of two modes of operation.

In another embodiment, a communication system comprising a serializer is disclosed. The serializer comprises a clock input configured to receive a clock signal and a parallel data input configured to receive 2N+1 bits in parallel where N is an integer, the parallel data input comprising a divided clock input. The serializer also comprises a divider configured to receive the clock signal from the clock input and output a first divided clock signal to the divided clock input and a shift register. The shift register comprises a first branch of N+1 registers, a second branch of N+1 registers and an inverter configured to receive the clock signal and provide an inverted clock signal to the first branch. The shift register also comprises an output combining outputs from the first branch and the second branch at twice a frequency of the clock signal. The serializer also comprises a selector configured to route bits received at the parallel data input to registers within the shift register according to one of two modes of operation. The communication system also comprises a serial bus coupled to the output of the serializer and a deserializer coupled to the serial bus, the deserializer configured to assemble a parallel data signal from bits received over the serial bus.

In another embodiment, a method comprising receiving parallel data bits at a parallel data input and passing the parallel data bits to a selector is disclosed. The method also comprises passing the parallel data bits to a shift register operating in a first mode using a half-rate clock and passing the parallel data bits to the shift register operating in a second mode using the half-rate clock. The method also comprises assembling a serial stream of bits at a full rate clock frequency and sending the serial stream of bits over a data bus.

BRIEF DESCRIPTION OF THE FIGURES

FIG. 4A is a simplified schematic of the serializer of FIG. 2 operating in a first mode of operation;

FIG. 4B is a simplified schematic of the serializer of FIG. 2 operating in a second mode of operation;

DETAILED DESCRIPTION

Figure 1:
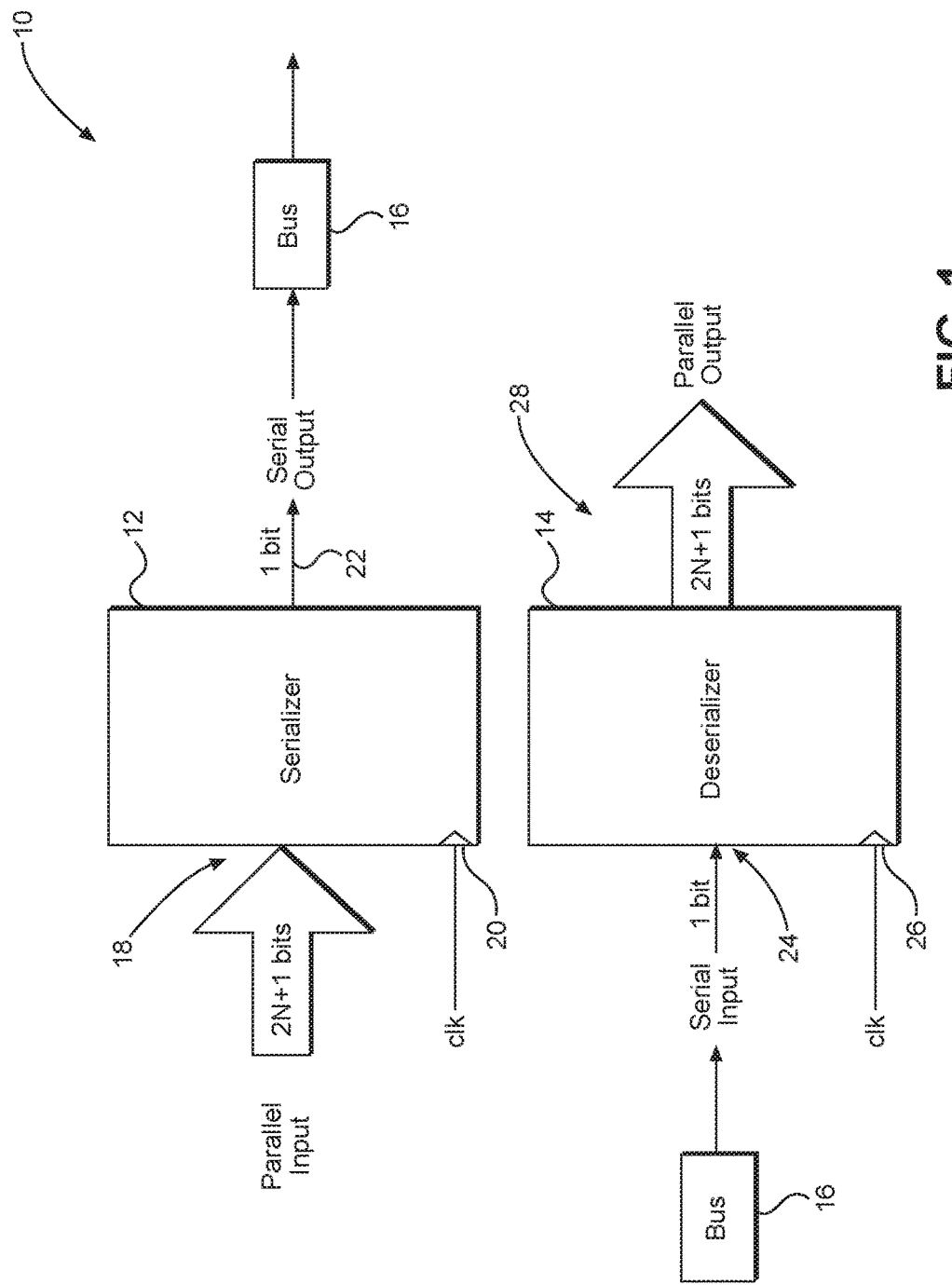
FIG. 1 is a block diagram of an exemplary communication system with a serializer and a deserializer coupled to a data bus.

With reference now to the drawing figures, several exemplary embodiments of the present disclosure are described. The word "exemplary" is used herein to mean "serving as an example, instance, or illustration." Any embodiment described herein as "exemplary" is not necessarily to be construed as preferred or advantageous over other embodiments.

Embodiments disclosed in the detailed description include serializers and deserializers for odd ratio parallel data buses. In particular, serializers and deserializers operating with an odd number of parallel data bits work with a half-rate clock to provide a serial data stream at a full clock rate.

By providing a half-rate clock, power and area (i.e., die size or chip size) are conserved on the integrated circuit (IC) incorporating the serializer. Additionally, by providing a 7:1 serializer, the bus is now compatible with the MIPI® (Mobile Industry Processor Interface) C-PHY standard.

In this regard, FIG. 1 is a simplified block diagram of a communication system 10 with a serializer 12 and a deserializer 14 linked by a data bus 16. The serializer 12 receives a parallel input of 2N+1 bits at a parallel data input 18 and a clock signal at a clock input 20, where N is an integer. Thus, the serializer 12 receives an odd number of parallel bits (e.g., 3, 5, 7, etc.). The serializer 12 outputs a single bit stream at output 22 onto the data bus 16. The serial data on the data bus 16 is received at a receiver input 24 at the deserializer 14. The deserializer 14 also receives a clock signal at clock input 26 and outputs the 2N+1 bits as a parallel data stream at output 28. While embodiments of the present disclosure are applicable to any odd number of parallel bits, a 7:1 serializer is of particular interest to support the MIPI C-PHY protocol which has a seven bit data stream.

Figure 2:
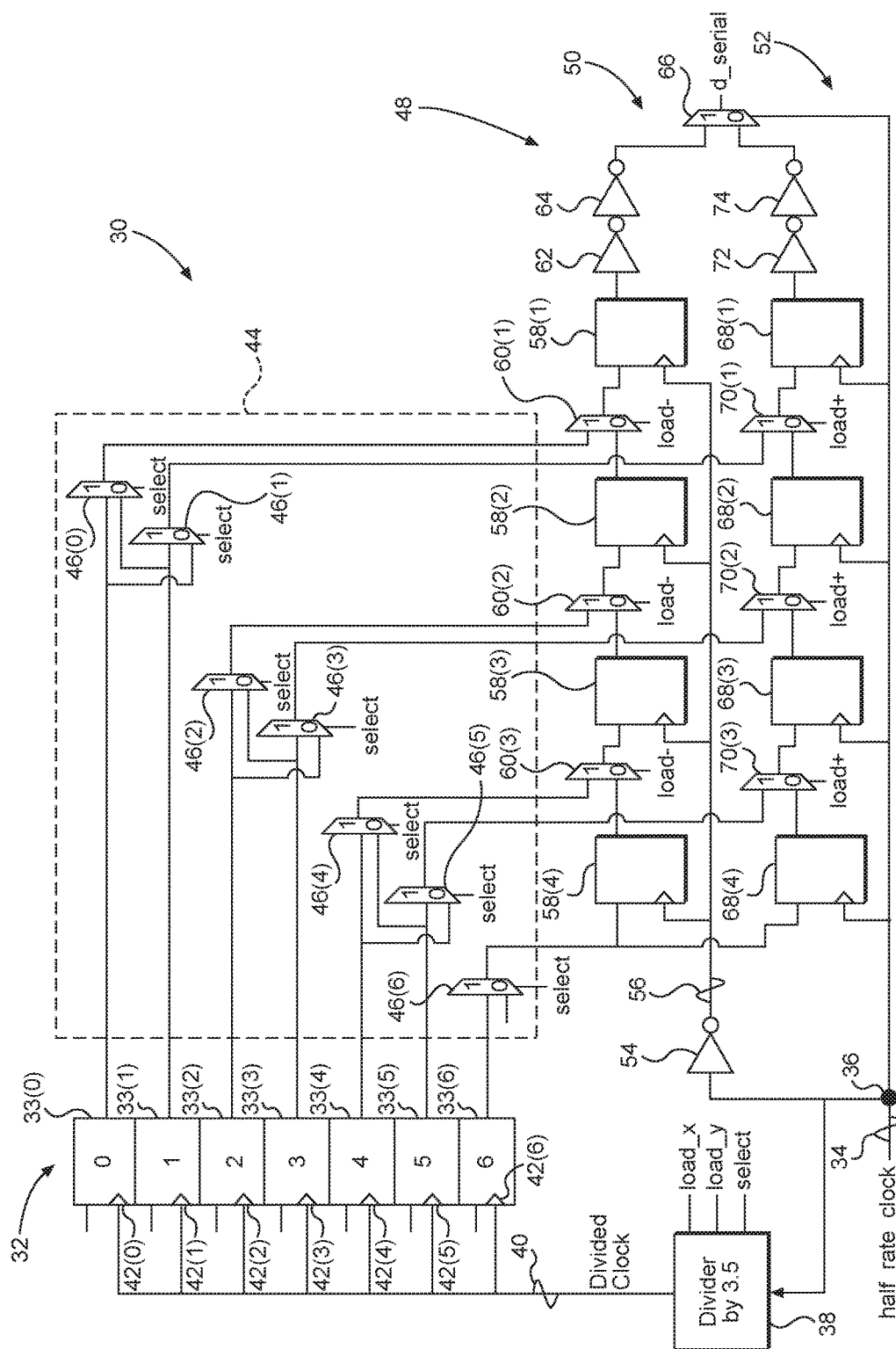
FIG. 2 is a simplified schematic of a 7:1 serializer using a half-rate clock according to an exemplary embodiment of the present disclosure.

In this regard, FIG. 2 illustrates a 7:1 serializer 30 that receives seven parallel bits (d_parallel[0-6]) at the parallel data input 32. The parallel data input 32 is formed from respective registers 33(0)-33(6), one for each bit. A half-rate clock signal 34 is provided to the serializer 30 at a clock input 36. The half-rate clock signal 34 is provided to a divider 38, which in this case is a divide by 3.5 to provide a divided clock signal 40. The divided clock signal 40 is provided to the parallel data input 32 at respective divided clock inputs 42(0)-42(6) of the respective registers 33(0)-33(6). The outputs (din[0-6]) of the registers 33(0)-33(6) are coupled to a selector 44.

With continued reference to FIG. 2, in an exemplary embodiment, the selector 44 is formed from multiplexers (MUX) 46(0)-46(1), one for each register 33. In an alternate embodiment, not illustrated, the MUX 46(0)-46(1) can be replaced with switches. The MUX 46(0) receives din[0] and din[1] and selectively passes a selected signal to a shift register 48 as further explained below. The MUX 46(1) similarly receives din[1] and din[0] and passes a selected signal to the shift register 48. The MUX 46(2) receives din[2] and din[3] and passes a selected signal to the shift register 48. The MUX 46(3) similarly receives din[3] and din[2] and passes a selected signal to the shift register 48. The MUX 46(4) receives din[4] and din[5] and passes a selected signal to the shift register 48. The MUX 46(5) similarly receives din[5] and din[4] and passes a selected signal to the shift register 48. The MUX 46(6) receives din[6] and zero (0) and passes a selected signal to the shift register 48. The MUXes 46 are controlled by a select signal generated by the divider 38 (note that the connections between the divider 38 and the MUXes 46 are not shown to avoid unnecessarily cluttering FIG. 2).

With continued reference to FIG. 2, the shift register 48 includes a first branch 50 and a second branch 52 as well as an inverter 54. The inverter 54 receives the half-rate clock signal 34 and provides an inverted clock signal 56 to the first branch 50. The second branch 52 receives an unadulterated version of the clock signal 34. The first branch 50 includes registers 58(1)-58(4). The registers 58(1)-58(4) receive the inverted clock signal 56. Register 58(4) receives its data signal from selector 44 (either da[6] or 0). Registers 58(1)-58(3) have associated MUX 60(1)-60(3) that select between an output of the previous register or the signal from the selector 44 based on a load_neg (also referred to as load−) signal. Thus, for example, register 58(3) receives the output of the register 58(4) or the output of the MUX 46(4) (i.e., either da[4] or da[5]) and generates an output that is passed to the MUX 60(2). The output of the register 58(1) goes through two inverters 62, 64 to an output MUX 66. It should be appreciated that the two inverters 62, 64 act as a buffer and are optional. The source of the load_neg signal is discussed below with reference to FIG. 3.

With continued reference to FIG. 2, the second branch 52 includes registers 68(1)-68(4). The registers 68 receive the half-rate clock signal 34. Register 68(4) receives its data signal from selector 44 (either da[6] or 0). Registers 68(1)-68(3) have associated MUX 70(1)-70(3) that select between an output of the previous register or the signal from the selector 44 based on a load_pos (also referred to as load+) signal. Thus, for example, register 68(3) receives the output of the register 68(4) or the output of the MUX 46(5) (i.e., either da[4] or da[5]) and generates an output that is passed to the MUX 70(2). The output of the register 68(1) goes through two inverters 72, 74 to the output MUX 66. Again, these inverters 72, 74 act as a buffer and are optional. The source of the load_pos signal is discussed below with reference to FIG. 3.

With continued reference to FIG. 2, the output MUX 66 generates a serial output signal d_serial at an effective frequency of twice the half-rate clock signal 34 because both edges of the half-rate clock signal 34 are employed to serialize the input bits.

Figure 3:
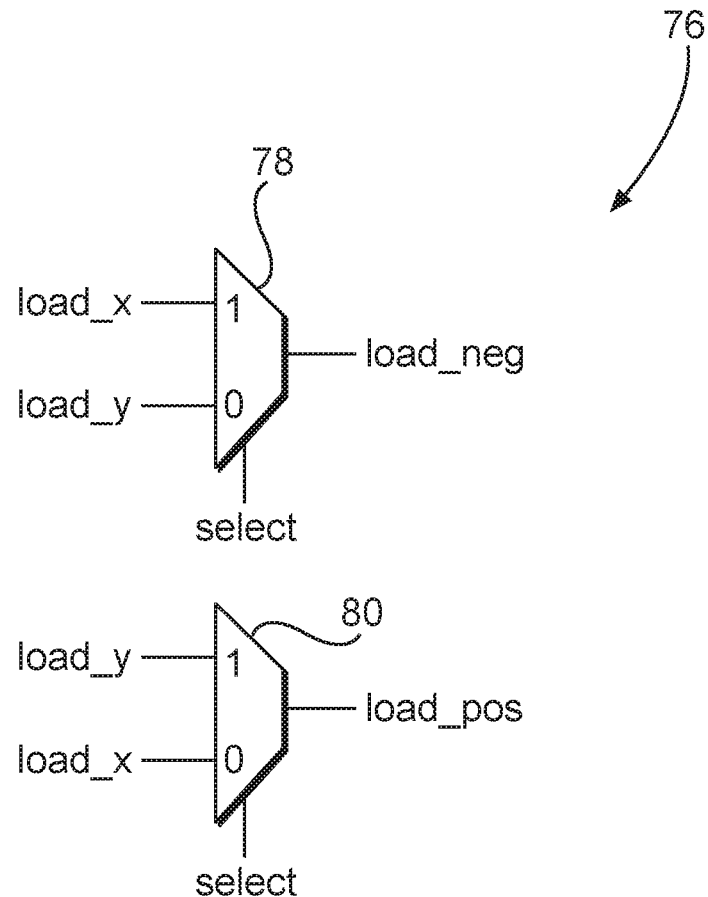
FIG. 3 illustrates a simplified schematic of a load multiplexing system for use with the serializer of FIG. 2.

The divider 38 also generates a load_x and a load_y signal, which are passed to a load controller 76 illustrated in FIG. 3. The load controller 76 includes a first MUX 78 that receives both load_x and load_y and selects between them based on the select signal to generate a load_neg (load−) signal. Similarly, the load controller 76 includes a second MUX 80 that receives both load_x and load_y (although at opposite inputs) and selects between them based on the select signal to generate a load_pos (load+) signal. The load_neg and load_pos signals are the load signals provided to the MUX 60, 70 of the shift register 48.

In practice, the serializer 30 operates in two modes and alternates between them based on the select signal from the divider 38. The two modes are illustrated in FIGS. 4A and 4B. In this regard, FIG. 4A illustrates a first mode where the MUX 60 of the first branch 50 receives the load_neg signal from the load controller 76. Likewise the MUX 60 receives the odd bits from the MUX 46 within the selector 44. In contrast, the MUX 70 of the second branch 52 receives the load_pos signal from the load controller 76 and the even bits from the MUX 46 within the selector 44. A zero signal is sent to the register 58(4) and thus the register 58(4) passes a zero to the MUX 60(3). The register 68(4) receives din[4] and passes the same to the MUX 70(3).

The second mode, illustrated in FIG. 4B essentially reverses the first mode and the MUX 60 of the first branch 50 receives the even bits and the MUX 70 of the second branch 52 receives the odd bits. The register 58(4) receives din[4] and the register 68(4) receives a zero. Again, the select signal effectively toggles the shift register 48 between the two modes.

Figure 5:
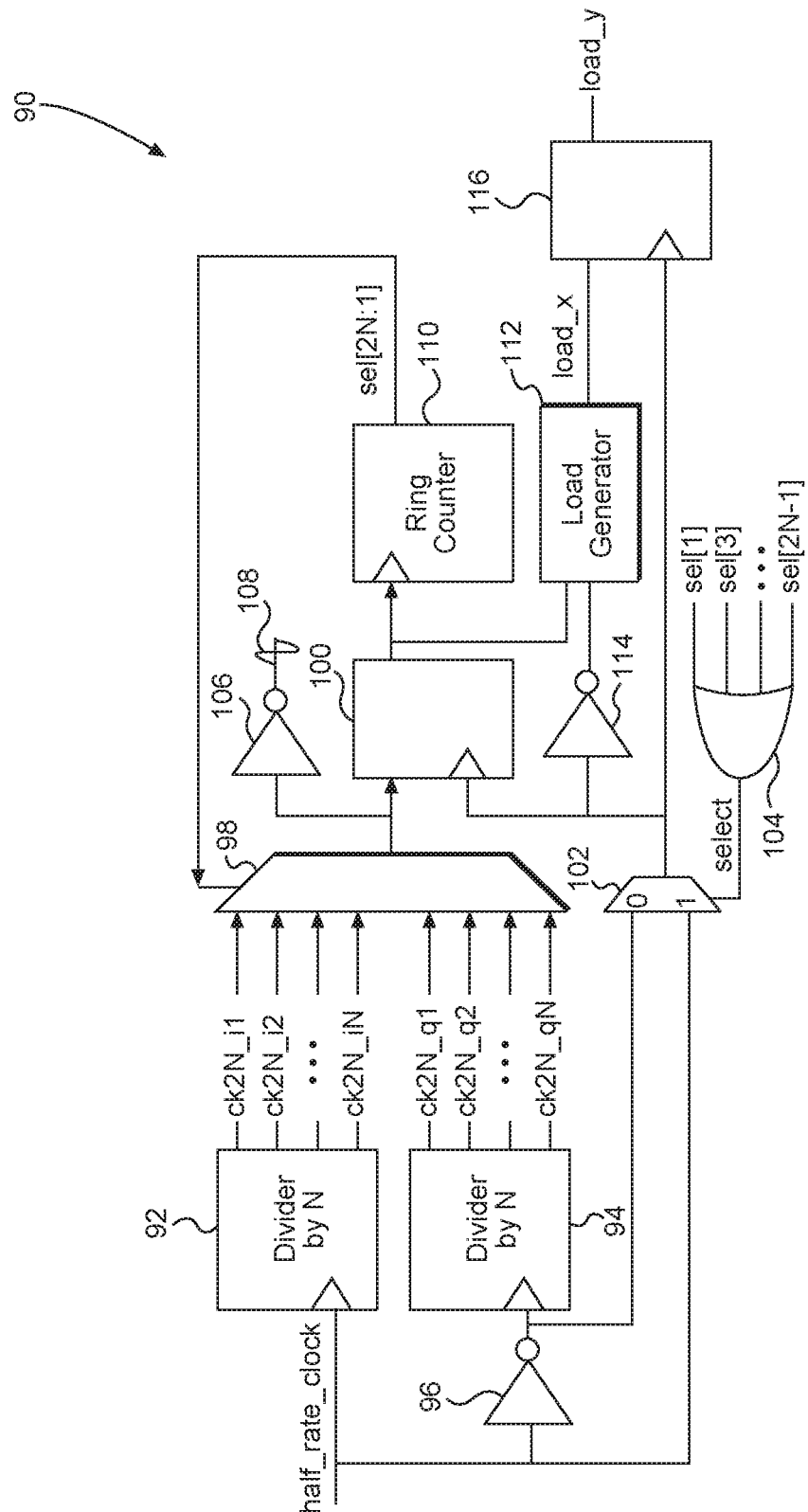
FIG. 5 is a simplified schematic of an exemplary divider such as that used in the serializer of FIG. 2.

FIG. 5 illustrates an exemplary divider 90, which may be used as divider 38 of FIG. 2. The divider 90 receives the half-rate clock signal and provides the half-rate clock signal to a first divide by N divider 92 and an inverted half-rate clock signal to a second divide by N divider 94. The half-rate clock signal is inverted by an inverter 96. The divide by N dividers 92, 94 provide outputs to a MUX 98. The MUX 98 provides an input to register 100. The register 100 is clocked by a signal from a MUX 102. The MUX 102 receives the half-rate clock signal and the inverted half-rate clock signal and selects between them based on a select signal from OR gate 104. The output of the MUX 98 is also provided to an inverter 106 to form a divided by N.5 clock signal 108 (e.g., using the divider 38, this is the divided by 3.5 divided clock signal 40). The output of the register 100 is passed to a ring counter 110 and a load generator 112. The output of the ring counter 110 is the select signal passed to the MUX 98 and the input passed to the OR gate 104, which generates a select signal for serializer. The load generator 112 also receives the output of the MUX 102, albeit inverted by inverter 114. The output of the load generator 112 is load_x which is received by a register 116. The register 116 also receives the output of the MUX 102 and generates load_y. As noted above, load_x and load_y are used by the load controller 76 (FIG. 3) and the select signal is used by both the serializer 30 (FIG. 2) and load controller 76 (FIG. 3).

Figure 6:
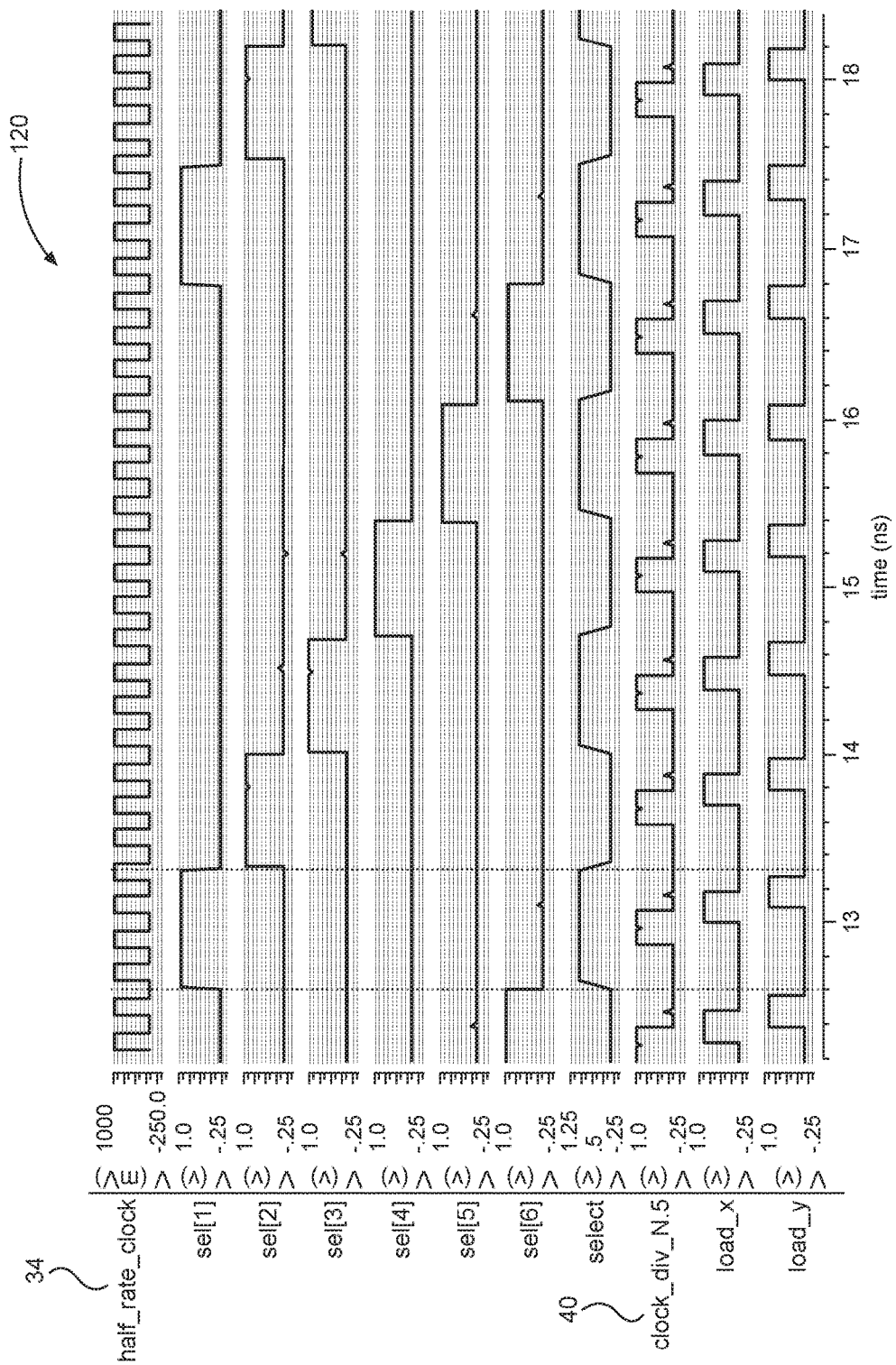
FIG. 6 is an exemplary signal output from a bench test circuit of the serializer of FIG. 2.

When implemented as illustrated, the serializer 30 may provide signals as shown on graph 120 illustrated in FIG. 6. In addition to the half-rate clock signal 34 and the divide by N.5 signal (e.g., divide by 3.5 or divided clock signal 40), the various select signals received by the OR gate 104 are illustrated as well as the select signal that is used throughout the serializer 30. Finally, load_x and load_y are illustrated. As the time scale is uniform, it is readily apparent how the various signals change as a function of the half-rate clock signal 34.

Figure 7:
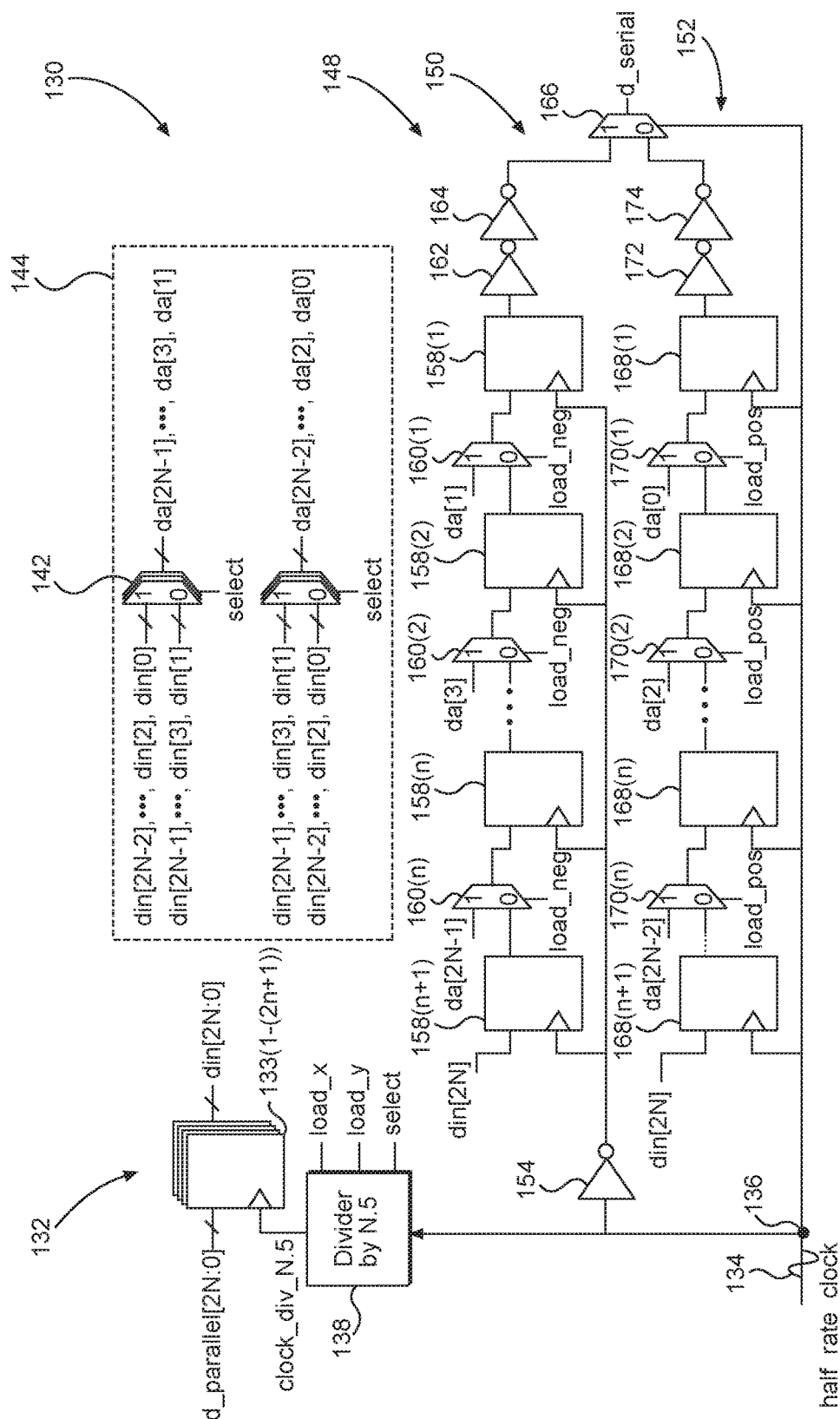
FIG. 7 is a simplified schematic of a generic odd ratio serializer using a half-rate clock according to an exemplary embodiment of the present disclosure.

While the above discussion is focused on a 7:1 serializer because of its utility with the MIPI C-PHY, the present disclosure is not so limited, and a generic 2N+1 serializer 130 is illustrated in FIG. 7. The serializer 130 includes a parallel data input 132 with registers 133(1–(2N+1)). The serializer 130 receives a half-rate clock signal 134 at clock input 136. The registers 133 output din[2N:0] which is provided to the selector 144 and the MUX 142 therein. The output of the MUX 142 is provided to the shift register 148. The shift register 148 has first branch 150 and second branch 152 with registers 158(1–(N+1)) and 168(1–(N+1)) therein respectively. Likewise, the first branch 150 has MUX 160 (1–(N)) and the second branch 152 has MUX 170(1–(N)) that receive signals from the selector 144. Inverters 162, 164, 172, 174 are used much like inverters 62, 64, 72, 74 in that they are optional buffers. A divide by N.5 divider 138 operates similarly to divide by 3.5 divider 38, and inverter 154 also inverts the half-rate clock signal 134 for the first branch 150. Thus, other than the number of elements, serializer 130 is similar to serializer 30.

Figure 8:
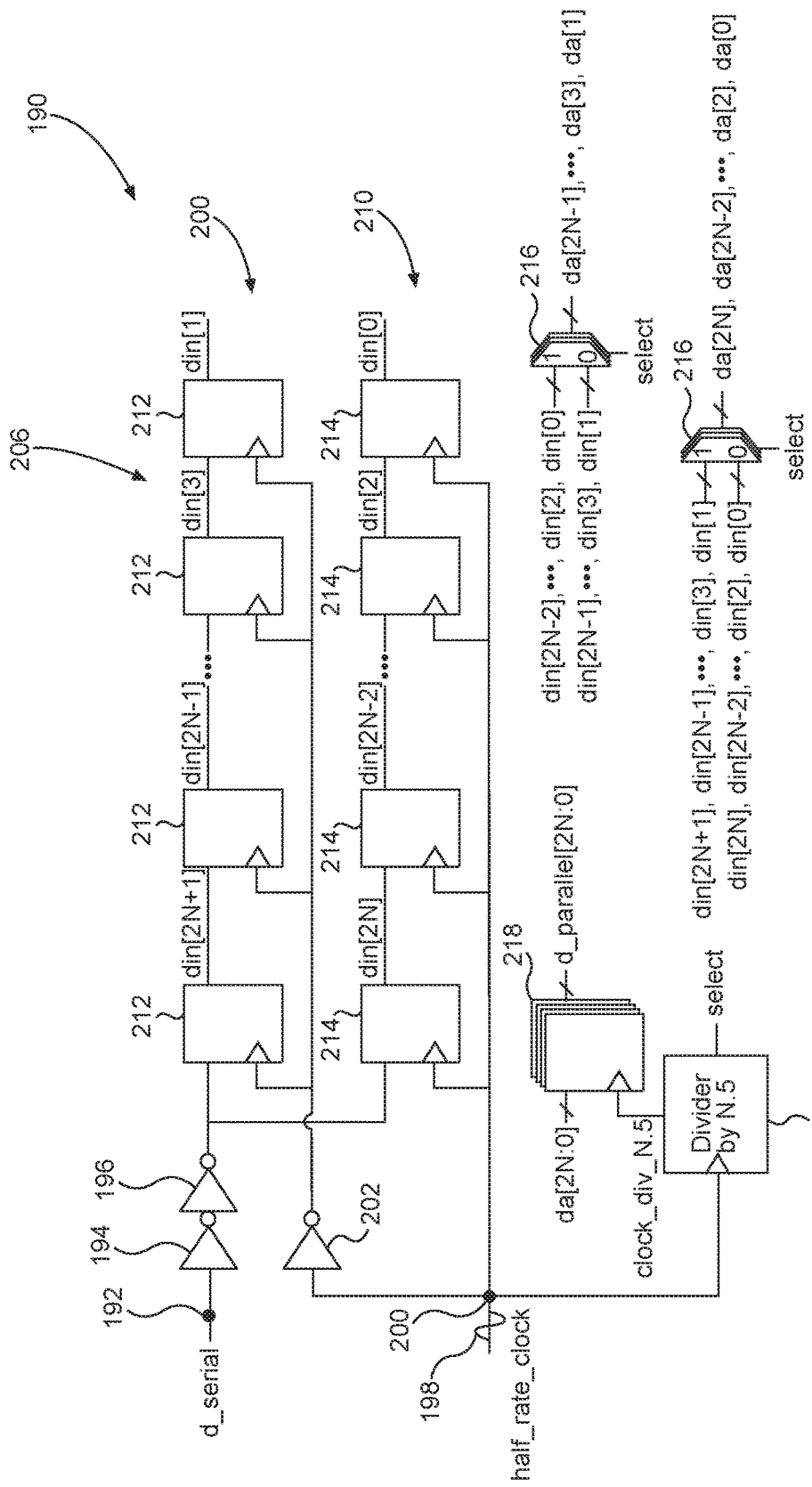
FIG. 8 is a simplified schematic of a generic odd ratio deserializer configured to work with the generic serializer of FIG. 7.

It should be appreciated that once a 7:1 or other 2N+1:1 ratio serializer is provided, a deserializer is also needed. In the abstract, the deserializer just reverses the serializer. In this regard, FIG. 8 illustrates an exemplary 2N+1 deserializer 190. The deserializer 190 receives serial data at a receiver input 192 and buffers the data with inverters 194, 196. As with the other inverters, inverters 194, 196 are optional. A half-rate clock signal 198 arrives at a clock input 200 and is provided to an inverter 202 and a divide by N.5 divider 204, which can be similar to divider 138 (e.g., if the divider 138 is a divide by 3.5, then the divider 204 is also a divide by 3.5). Because the deserializer 190 is simpler than a corresponding serializer, the divider 204 outputs only a select signal (i.e., load_x and load_y are not needed). The deserializer 190 also includes a shift register 206 that has a first branch 208 and a second branch 210. The first branch 208 receives the inverted clock signal from inverter 202 and the second branch 210 receives an unadulterated clock signal from clock input 200. The first branch 208 has a plurality of registers 212. The second branch 210 has a plurality of registers 214. The registers 212, 214 generate respective bits which are then passed to MUX 216 which in turn generate parallel bits at registers 218, based on the select signal from divider 204.

Figure 9:
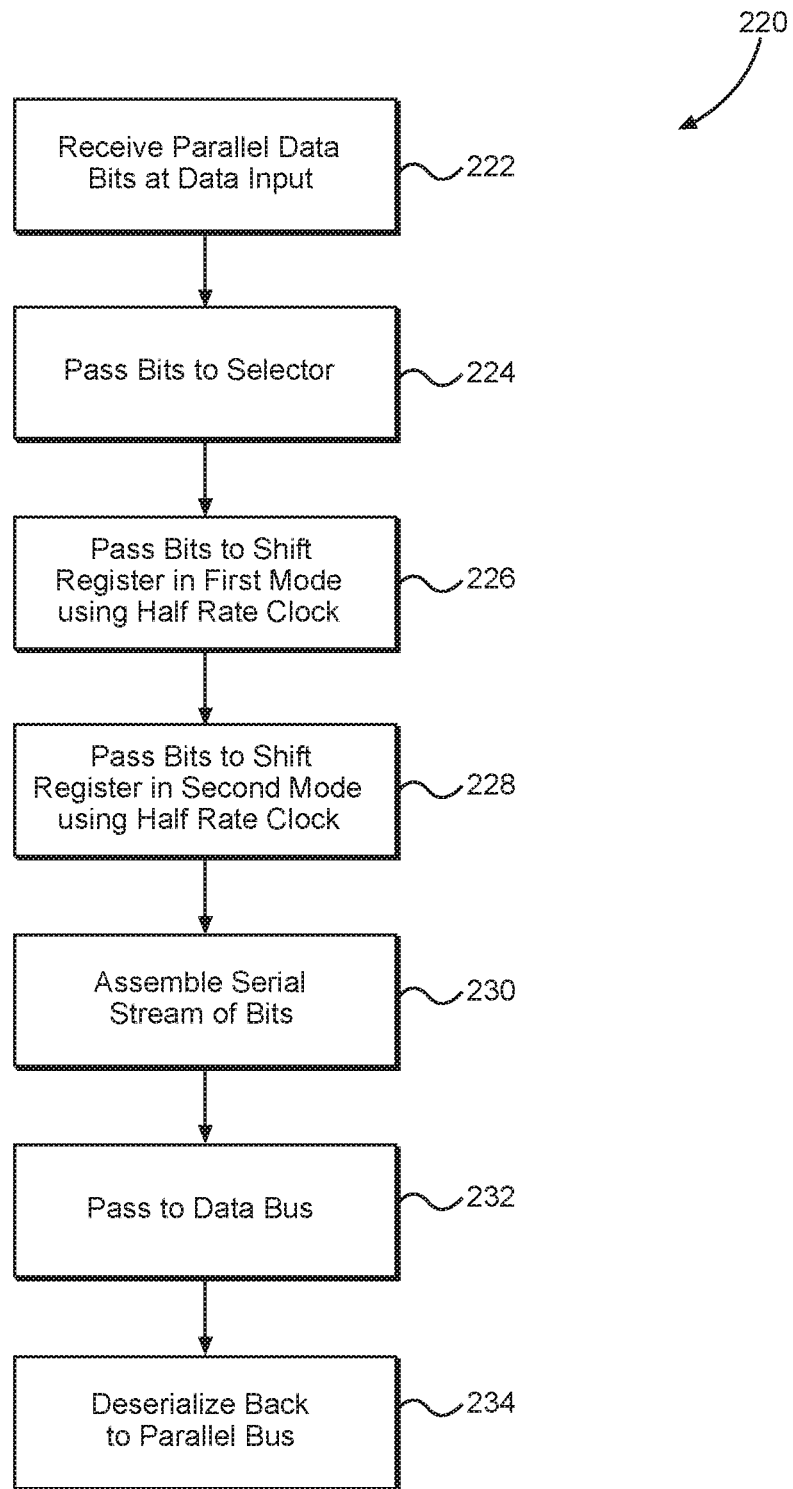
FIG. 9 is a flow chart illustrating an exemplary process using the serializers according to exemplary embodiments of the present disclosure.

Coupled with the embodiments described above, the present disclosure provides a process 220 of serializing and deserializing as illustrated in FIG. 9. Process 220 begins with the receipt of the parallel data bits at the parallel data input 32 (block 222). The parallel bits are passed to the selector 44 (block 224) where they are selected by the MUX 46 based on the select signal. The selected bits are passed to the shift registers of the first branch 50 and the second branch 52 in a first mode using the half-rate clock (block 226). The select signal changes, and the MUX 46 select different bits which are passed to the shift registers of the first branch 50 and the second branch 52 in a second mode using the half-rate clock (block 228). The shift register 48 assembles the outputs of the first branch 50 and second branch 52 into a serial stream of bits at a full data rate at the output MUX 66 (block 230) and the assembled stream is passed onto a data bus (block 232). The data is received at a receiver and particularly at a deserializer in the receiver and deserialized back to parallel bits (block 234).

Figure 10:
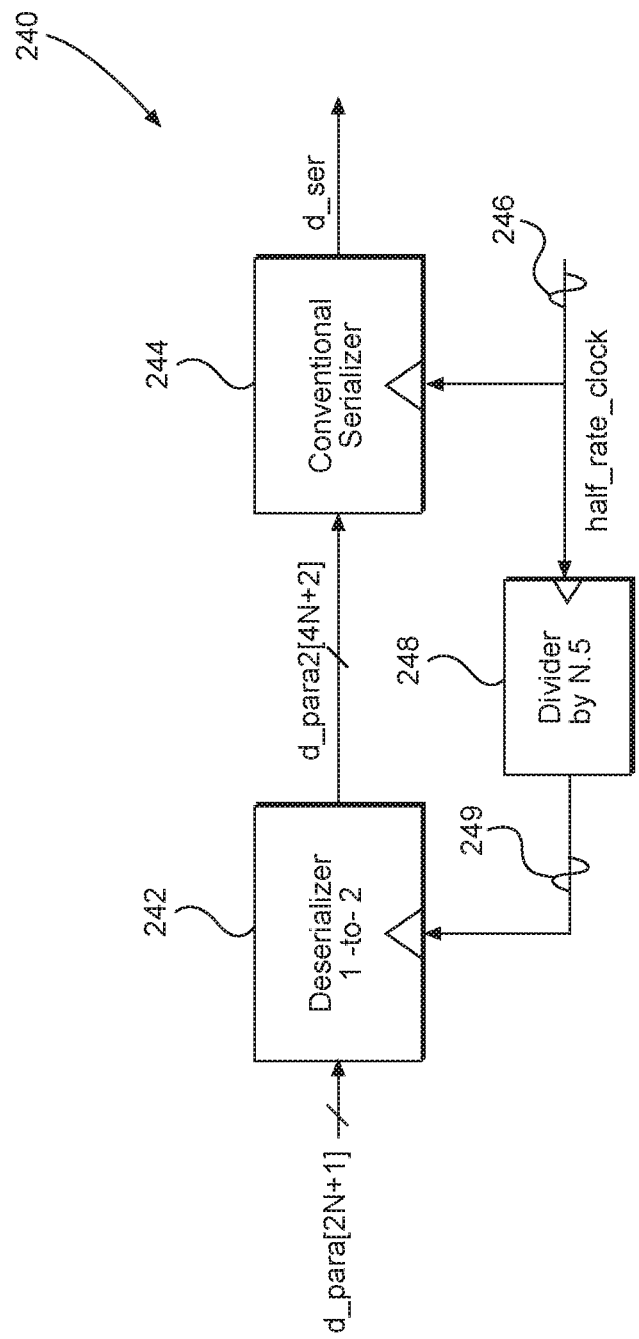
FIG. 10 is a simplified schematic of an exemplary embodiment of an odd ratio serializer using a half-rate clock.

While the serializer 30 and serializer 130 are specifically contemplated, there are other ways to build an odd ratio serializer using a half-rate clock. In this regard, FIG. 10 illustrates a serializer 240 that initially receives an odd number of parallel bits at a sub-deserializer 242. Sub-deserializer 242 expands the odd number of parallel bits by a factor of 2, which are then passed to a sub-serializer 244. Because the number of bits is now an even number, an even ratio architecture may be used. The half-rate clock signal 246 is provided to the sub-serializer 244 and a divide by N.5 divider 248. The further divided clock signal 249 is provided the sub-deserializer 242.

The odd ratio serializers and deserializers according to embodiments disclosed herein may be provided in or integrated into any processor-based device. Examples, without limitation, include a set top box, an entertainment unit, a navigation device, a communications device, a fixed location data unit, a mobile location data unit, a mobile phone, a cellular phone, a computer, a portable computer, a desktop computer, a personal digital assistant (PDA), a monitor, a computer monitor, a television, a tuner, a radio, a satellite radio, a music player, a digital music player, a portable music player, a digital video player, a video player, a digital video disc (DVD) player, and a portable digital video player.

Figure 11:
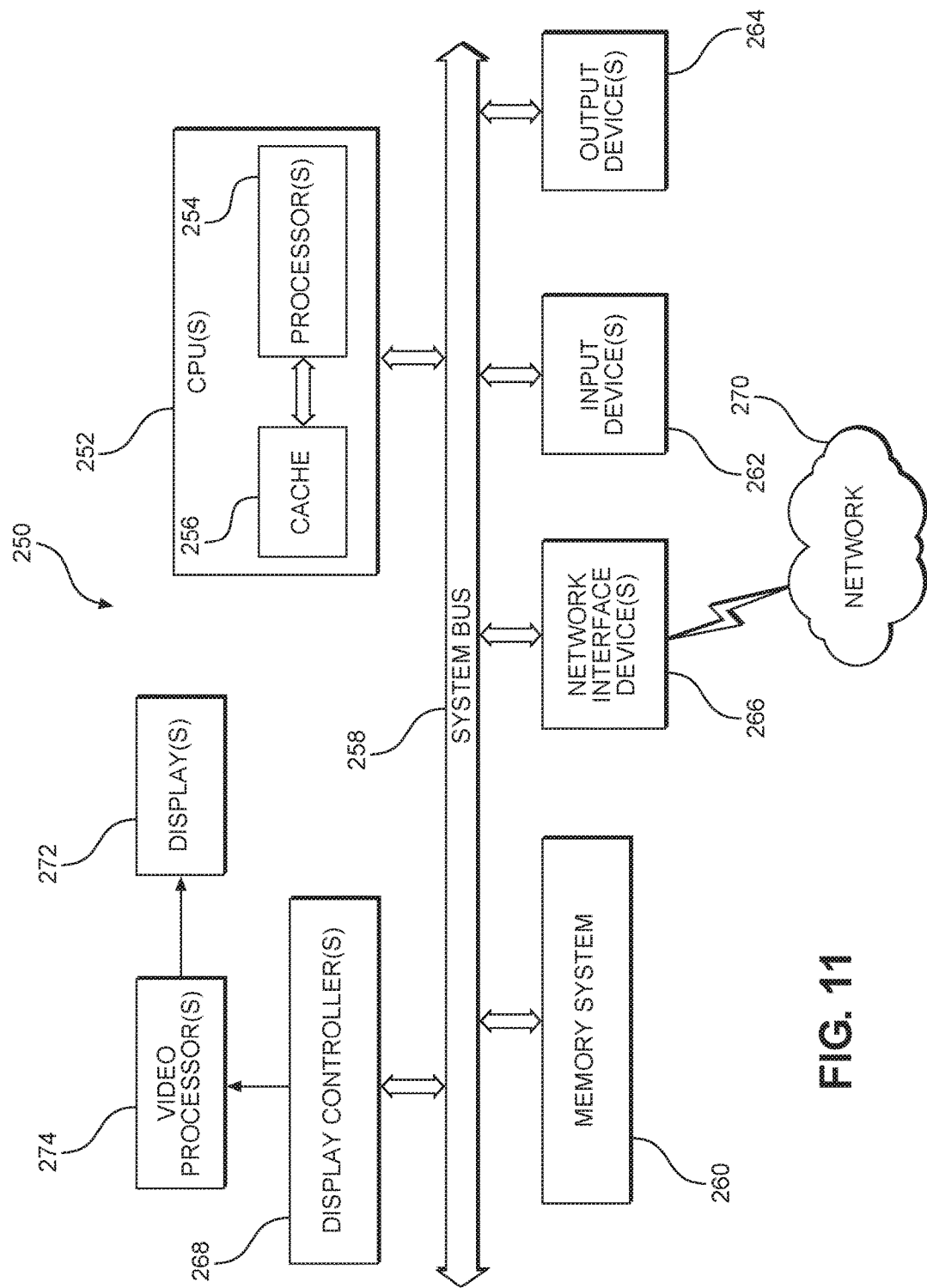
FIG. 11 is a block diagram of an exemplary processor-based system that can include the communication system of FIG. 1.

In this regard, FIG. 11 illustrates an example of a processor-based system 250 that can employ the communication system 10 illustrated in FIG. 1 using exemplary embodiments of the serializers and deserializers disclosed herein. In this example, the processor-based system 250 includes one or more central processing units (CPUs) 252, each including one or more processors 254. The CPU(s) 252 may have cache memory 256 coupled to the processor(s) 254 for rapid access to temporarily stored data. The CPU(s) 252 is coupled to a system bus 258, such as through a serializer 30 or serializer 130. Other buses that utilize the communication system 10 may also exist in the processor based system 250. As is well known, the CPU(s) 252 communicates with these other devices by exchanging address, control, and data information over the system bus 258. For example, the CPU(s) 252 can communicate bus transaction requests to the memory system 260. Although not illustrated in FIG. 11, multiple buses could be provided, each having its own serializer and deserializer. Further, within a single multipath bus, multiple serializers and deserializers may be used.

Other devices can be connected to the system bus 258. As illustrated in FIG. 11, these devices can include a memory system 260, one or more input devices 262, one or more output devices 264, one or more network interface devices 266, and one or more display controllers 268, as examples. The input device(s) 262 can include any type of input device, including but not limited to input keys, switches, voice processors, etc. The output device(s) 264 can include any type of output device, including but not limited to audio, video, other visual indicators, etc. The network interface device(s) 266 can be any devices configured to allow exchange of data to and from a network 270. The network 270 can be any type of network, including but not limited to a wired or wireless network, private or public network, a local area network (LAN), a wide local area network (WLAN), and the Internet. The network interface device(s) 266 can be configured to support any type of communication protocol desired.

The CPU(s) 252 may also be configured to access the display controller(s) 268 over the system bus 258 to control information sent to one or more displays 272. The display controller(s) 268 sends information to the display(s) 272 to be displayed via one or more video processors 274, which process the information to be displayed into a format suitable for the display(s) 272. The display(s) 272 can include any type of display, including but not limited to a cathode ray tube (CRT), a liquid crystal display (LCD), a plasma display, etc.

Those of skill in the art will further appreciate that the various illustrative logical blocks, modules, circuits, and algorithms described in connection with the embodiments disclosed herein may be implemented as electronic hardware, instructions stored in memory or in another computer-readable medium and executed by a processor or other processing device, or combinations of both. The devices described herein may be employed in any circuit, hardware component, integrated circuit (IC), or IC chip, as examples. Memory disclosed herein may be any type and size of memory and may be configured to store any type of information desired. To clearly illustrate this interchangeability, various illustrative components, blocks, modules, circuits, and steps have been described above generally in terms of their functionality. How such functionality is implemented depends upon the particular application, design choices, and/or design constraints imposed on the overall system. Skilled artisans may implement the described functionality in varying ways for each particular application, but such implementation decisions should not be interpreted as causing a departure from the scope of the present disclosure.

The various illustrative logical blocks, modules, and circuits described in connection with the embodiments disclosed herein may be implemented or performed with a processor, a Digital Signal Processor (DSP), an Application Specific Integrated Circuit (ASIC), a Field Programmable Gate Array (FPGA) or other programmable logic device, discrete gate or transistor logic, discrete hardware components, or any combination thereof designed to perform the functions described herein. A processor may be a microprocessor, but in the alternative, the processor may be any conventional processor, controller, microcontroller, or state machine. A processor may also be implemented as a combination of computing devices, e.g., a combination of a DSP and a microprocessor, a plurality of microprocessors, one or more microprocessors in conjunction with a DSP core, or any other such configuration.

The embodiments disclosed herein may be embodied in hardware and in instructions that are stored in hardware, and may reside, for example, in Random Access Memory (RAM), flash memory, Read Only Memory (ROM), Electrically Programmable ROM (EPROM), Electrically Erasable Programmable ROM (EEPROM), registers, a hard disk, a removable disk, a CD-ROM, or any other form of computer readable medium known in the art. An exemplary storage medium is coupled to the processor such that the processor can read information from, and write information to, the storage medium. In the alternative, the storage medium may be integral to the processor. The processor and the storage medium may reside in an ASIC. The ASIC may reside in a remote station. In the alternative, the processor and the storage medium may reside as discrete components in a remote station, base station, or server.

It is also noted that the operational steps described in any of the exemplary embodiments herein are described to provide examples and discussion. The operations described may be performed in numerous different sequences other than the illustrated sequences. Furthermore, operations described in a single operational step may actually be performed in a number of different steps. Additionally, one or more operational steps discussed in the exemplary embodiments may be combined. It is to be understood that the operational steps illustrated in the flow chart diagrams may be subject to numerous different modifications as will be readily apparent to one of skill in the art. Those of skill in the art will also understand that information and signals may be represented using any of a variety of different technologies and techniques. For example, data, instructions, commands, information, signals, bits, symbols, and chips that may be referenced throughout the above description may be represented by voltages, currents, electromagnetic waves, magnetic fields or particles, optical fields or particles, or any combination thereof.

The previous description of the disclosure is provided to enable any person skilled in the art to make or use the disclosure. Various modifications to the disclosure will be readily apparent to those skilled in the art, and the generic principles defined herein may be applied to other variations without departing from the spirit or scope of the disclosure. Thus, the disclosure is not intended to be limited to the examples and designs described herein, but is to be accorded the widest scope consistent with the principles and novel features disclosed herein.

What is claimed is:

1. A communication interface within an integrated circuit, the communication interface comprising a serializer, the serializer comprising:
   a clock input configured to receive a clock signal;
   parallel data input configured to receive 2N+1 bits in parallel where N is an integer, the parallel data input comprising a divided clock input;
   a divider configured to receive the clock signal from the clock input and output a first divided clock signal to the divided clock input;
   a shift register comprising:
      a first branch of N+1 registers;
      a second branch of N+1 registers;
      an inverter configured to receive the clock signal and provide an inverted clock signal to the first branch; and
      an output combining outputs from the first branch and the second branch at twice a frequency of the clock signal; and
   a selector configured to route bits received at the parallel data input to registers within the shift register according to one of two modes of operation.

2. The communication interface of claim 1, wherein N is three such that the serializer is a 7:1 serializer.

3. The communication interface of claim 1, wherein the selector comprises a plurality of multiplexers.

4. The communication interface of claim 1, wherein the selector comprises a plurality of switches.

5. The communication interface of claim 1, wherein the divider also outputs a select signal to the selector.

6. The communication interface of claim 1, wherein the first branch further comprises N multiplexers.

7. The communication interface of claim 6, wherein the divider further outputs a load signal to the N multiplexers in the first branch.

8. The communication interface of claim 1, wherein the first branch is configured to process even bits in a first mode of operation of the two modes of operation and processes odd bits in a second mode of operation of the two modes of operation.

9. The communication interface of claim 1 wherein the first branch processes bits on a negative clock edge and the second branch processes bits on a positive clock edge.

10. The communication interface of claim 1, wherein the serializer alternates between the two modes of operation.

11. The communication interface of claim 1 integrated into a device selected from the group consisting of a set top box, an entertainment unit, a navigation device, a communications device, a fixed location data unit, a mobile location data unit, a mobile phone, a cellular phone, a computer, a portable computer, a desktop computer, a personal digital assistant (PDA), a monitor, a computer monitor, a television, a tuner, a radio, a satellite radio, a music player, a digital music player, a portable music player, a digital video player, a video player, a digital video disc (DVD) player, and a portable digital video player.

12. A communication system comprising:
   a serializer comprising:
      a clock input configured to receive a clock signal;
      a parallel data input configured to receive 2N+1 bits in parallel where N is an integer, the parallel data input comprising a divided clock input;
      a divider configured to receive the clock signal from the clock input and output a first divided clock signal to the divided clock input;
      a shift register comprising:
         a first branch of N+1 registers;
         a second branch of N+1 registers;
         an inverter configured to receive the clock signal and provide an inverted clock signal to the first branch; and
         an output combining outputs from the first branch and the second branch at twice a frequency of the clock signal; and
      a selector configured to route bits received at the parallel data input to registers within the shift register according to one of two modes of operation;
   a serial bus coupled to the output of the serializer; and
   a deserializer coupled to the serial bus, the deserializer configured to assemble a parallel data signal from bits received over the serial bus.

13. The communication system of claim 12, wherein N is three.

14. A method comprising:
   receiving parallel data bits at a parallel data input;
   passing the parallel data bits to a selector;
   passing the parallel data bits to a shift register operating in a first mode using a half-rate clock;
   passing the parallel data bits to the shift register operating in a second mode using the half-rate clock;
   assembling a serial stream of bits at a full rate clock frequency; and
   sending the serial stream of bits over a data bus.

15. The method of claim 14, further comprising deserializing the serial stream of bits at a receiver.

16. The method of claim 14, further comprising selecting between the first mode and the second mode in alternating order.

17. The method of claim 14, further comprising dividing the half-rate clock and providing the divided clock to the parallel data input.

18. The method of claim 14, wherein receiving parallel data bits at the parallel data input comprises receiving seven parallel data bits.

19. The method of claim 14, wherein passing the parallel data bits to the shift register operating in the first mode using a half-rate clock comprises passing parallel data bits to a first branch and a second branch of the shift register.

20. The method of claim 19, wherein passing the parallel data bits to the first branch and the second branch of the shift register comprises using multiplexers to route the parallel data bits to the first branch or the second branch.

* * * * *